United States Patent
Bouchard (12)

(10) Patent No.: US 10,135,130 B1
(45) Date of Patent: Nov. 20, 2018

(54) ENCLOSURE FOR ELECTRONIC EQUIPMENT ON POLE

(71) Applicant: Bouchard Communications, Inc., North Hollywood, CA (US)

(72) Inventor: Kirk Edmund Bouchard, Canyon Country, CA (US)

(73) Assignee: Bouchard Communications, Inc., North Hollywood, CA (US)

( * ) Notice: Subject to any disclaimer, the term of this patent is extended or adjusted under 35 U.S.C. 154(b) by 0 days.

(21) Appl. No.: 15/936,974

(22) Filed: Mar. 27, 2018

Related U.S. Application Data

(60) Provisional application No. 62/500,016, filed on May 2, 2017.

(51) Int. Cl.
| | | |
|---|---|---|
| *H01Q 1/42* | (2006.01) | |
| *H05K 5/02* | (2006.01) | |
| *F21S 8/08* | (2006.01) | |
| *F21W 131/10* | (2006.01) | |

(52) U.S. Cl.
CPC ............... *H01Q 1/42* (2013.01); *F21S 8/086* (2013.01); *H05K 5/0217* (2013.01); *H05K 5/0226* (2013.01); *H05K 5/0239* (2013.01); *F21W 2131/10* (2013.01)

(58) Field of Classification Search
CPC ............ F21S 8/086; F21S 8/088; H01Q 1/42; H05K 5/0217; H05K 5/0226; H05K 5/0239; F21V 21/116; F21W 2131/10; G09F 2013/0431
See application file for complete search history.

(56) References Cited

U.S. PATENT DOCUMENTS

| | | | | |
|---|---|---|---|---|
| 5,291,211 | A * | 3/1994 | Tropper | H01Q 21/205 343/700 MS |
| 5,641,141 | A * | 6/1997 | Goodwin | H01Q 1/12 248/218.4 |
| 5,963,178 | A * | 10/1999 | Jones | H01Q 1/06 343/890 |
| 6,222,503 | B1 * | 4/2001 | Gietema | H01Q 1/1207 343/700 MS |

(Continued)

FOREIGN PATENT DOCUMENTS

| | | |
|---|---|---|
| CN | 201243079 Y * | 5/2009 |
| CN | 203521589 U * | 4/2014 |

(Continued)

*Primary Examiner* — Jacob J Cigna
(74) *Attorney, Agent, or Firm* — Siritzky Law, PLLC

(57) ABSTRACT

A system for concealing electronic equipment on a utility pole, the utility pole having an arm supporting at least one lamp. The system includes a mounting bracket, to be positioned on the utility pole; at least one equipment mounting plate, attachable to the mounting bracket. Each at least one equipment mounting plate is constructed and adapted to support a corresponding piece of communication equipment attached thereto; a concealment shroud having at least one slot and attachable to the mounting bracket; a bottom portion, attachable to the mounting bracket. A top part of the bottom portion has substantially the same shape as a bottom part of the concealment shroud. A cap is attachable to the mounting bracket. A bottom part of the cap has substantially the same shape as a top part of the concealment shroud.

20 Claims, 7 Drawing Sheets

(56) References Cited

U.S. PATENT DOCUMENTS

| | | | | |
|---|---|---|---|---|
| 6,739,561 B2* | 5/2004 | Herzog | H01Q 1/1221 | 248/218.4 |
| 8,593,370 B2* | 11/2013 | Caldwell | H01Q 1/1242 | 343/879 |
| 8,749,449 B2* | 6/2014 | Caldwell | H01Q 1/1242 | 343/879 |
| 9,252,479 B2* | 2/2016 | Kolokotronis | H01Q 1/1242 | |
| 9,748,630 B2* | 8/2017 | Tuau | H01Q 1/1242 | |
| 9,837,698 B2* | 12/2017 | Lasier | H01Q 1/1207 | |
| 2004/0080461 A1* | 4/2004 | Rothgeb | H01Q 1/424 | 343/720 |
| 2004/0248511 A1* | 12/2004 | Flynn | H04B 7/155 | 455/7 |
| 2007/0253208 A1* | 11/2007 | Howard | F21V 21/116 | 362/431 |
| 2009/0237918 A1* | 9/2009 | Yang | F21S 8/086 | 362/183 |
| 2013/0142372 A1* | 6/2013 | Harwood | H04R 1/028 | 381/334 |
| 2014/0065996 A1* | 3/2014 | Dickie | H01Q 1/1242 | 455/269 |
| 2014/0360559 A1* | 12/2014 | Braghiroli | F21S 8/086 | 136/251 |
| 2015/0043200 A1* | 2/2015 | Wilson | F21S 9/035 | 362/145 |
| 2015/0349399 A1* | 12/2015 | Lasier | H01Q 1/06 | 343/721 |
| 2015/0371571 A1* | 12/2015 | Hager | H04W 88/08 | 348/552 |
| 2016/0240114 A1* | 8/2016 | Rauma | G09F 7/22 | |
| 2017/0238432 A1* | 8/2017 | Lapham | H05K 5/0217 | 362/225 |
| 2017/0301977 A1* | 10/2017 | Caldwell | H01Q 1/1207 | |

FOREIGN PATENT DOCUMENTS

| | | | |
|---|---|---|---|
| CN | 204538191 U | * | 8/2015 |
| CN | 204720555 U | * | 10/2015 |

* cited by examiner

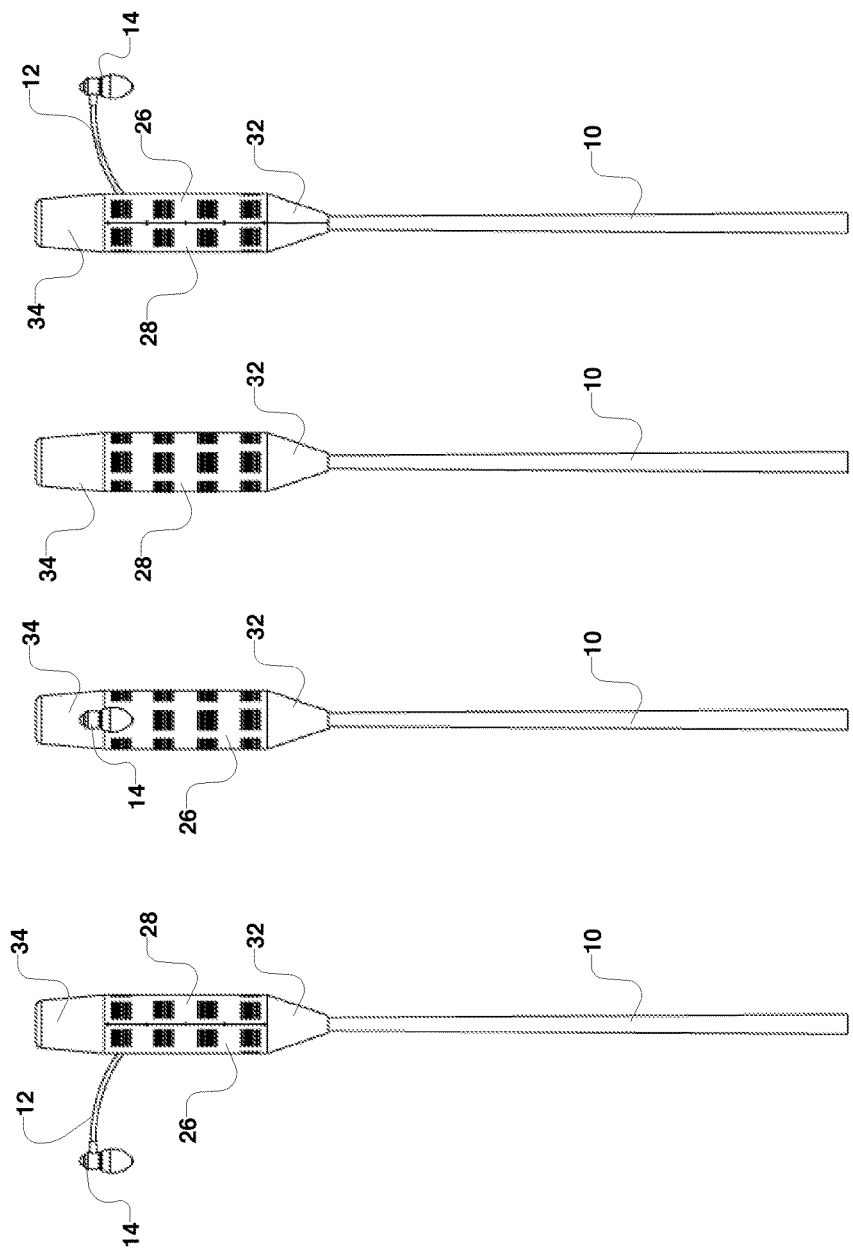

ENCLOSURE FOR ELECTRONIC EQUIPMENT ON POLE

CROSS-REFERENCE TO RELATED APPLICATIONS

This application claims the benefit of U.S. Provisional Application No. 62/500,016, filed May 2, 2017, the entire contents of which are hereby fully incorporated herein by reference for all purposes.

COPYRIGHT STATEMENT

This patent document contains material subject to copyright protection. The copyright owner has no objection to the reproduction of this patent document or any related materials in the files of the United States Patent and Trademark Office, but otherwise reserves all copyrights whatsoever.

FIELD OF THE INVENTION

This invention relates to utility and power poles, and, more particularly, to enclosures for concealing equipment on utility or power poles.

BACKGROUND AND OVERVIEW

Providers of cellular and wireless data communications systems are constantly in search of places to put their antenna systems and other communications systems, especially in urban areas. To this end, they often try to place antenna systems on existing infrastructure, including, in particular, on existing utility poles (e.g., light poles and the like).

However, many people consider these antenna systems unsightly, and so many communities have rules or regulations or even covenants that prohibit open placement of antenna systems and other communications equipment, even on existing utility poles. There have been some attempts to hide antenna systems inside of utility poles, but these approaches require complete replacement of an existing utility pole with a specialized concealment pole. These approaches have a few problems. First, many locales require that all of their utility poles have the same overall appearance. This means that a replacement utility pole will have to match the appearance of the existing utility poles in a particular locale, and this means that multiple types or styles of utility poles will have to be made to conform to multiple local requirements. Furthermore, the cost of removing an existing utility pole and replacing it with a customized pole is very high (currently on the order of at least $65,000).

It is desirable and an object of this invention is to provide a mechanism to attach and conceal an antenna system and/or other communications system on an existing utility pole. It is further desirable and an object of this invention to provide a kit that allows an existing pole to be retrofitted with a concealed antenna system, without requiring the pole to be replaced and without interfering with the operation of equipment already on the pole (e.g., a lamp system).

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein:

FIGS. 8A-8D show various views of a concealment enclosure kit according to exemplary embodiments hereof in place on a utility pole.

DETAILED DESCRIPTION OF THE PRESENTLY PREFERRED EXEMPLARY EMBODIMENTS

Figure 1A:
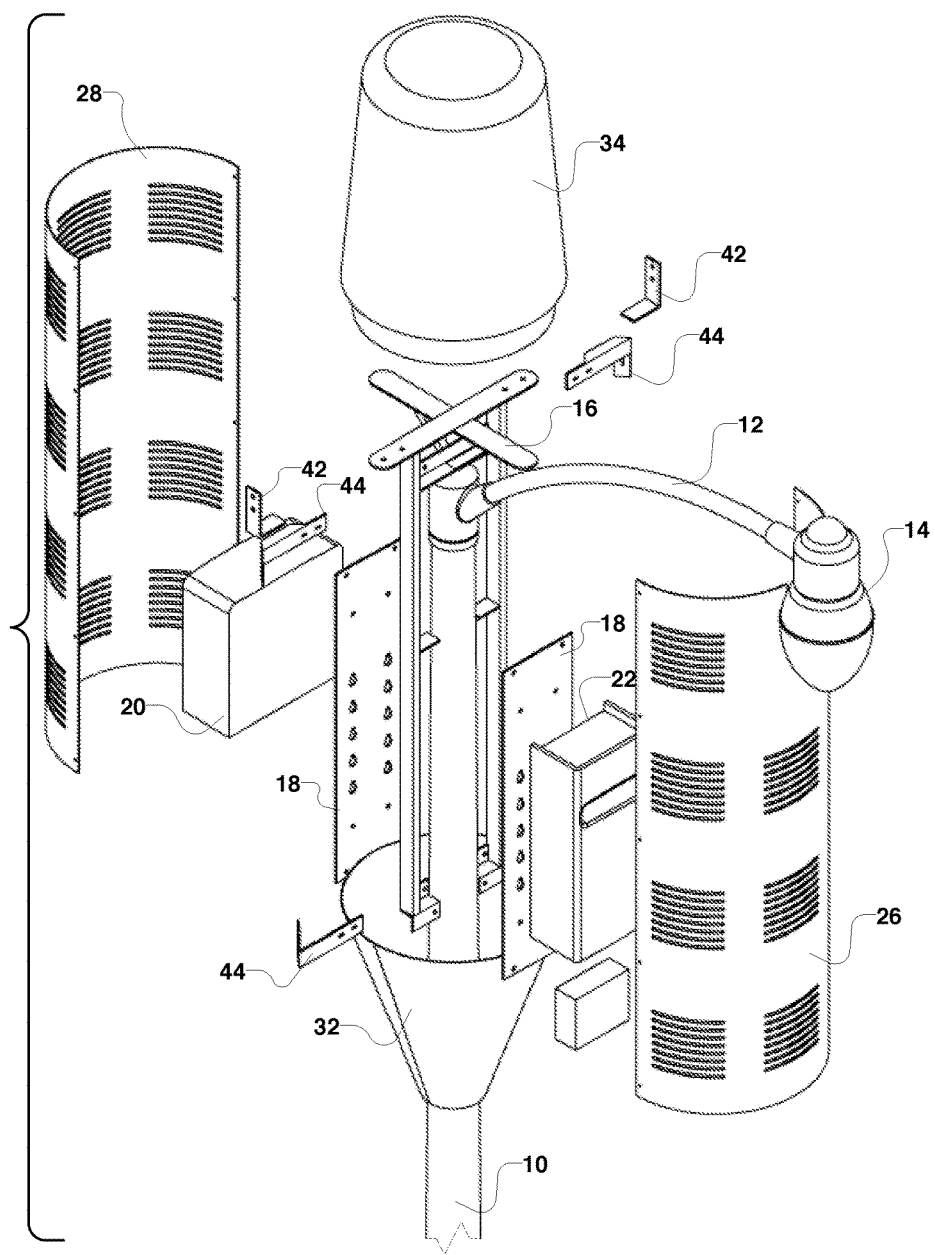
FIGS. 1A-1C show aspects of a concealment enclosure kit according to exemplary embodiments hereof.
Figure 1B:
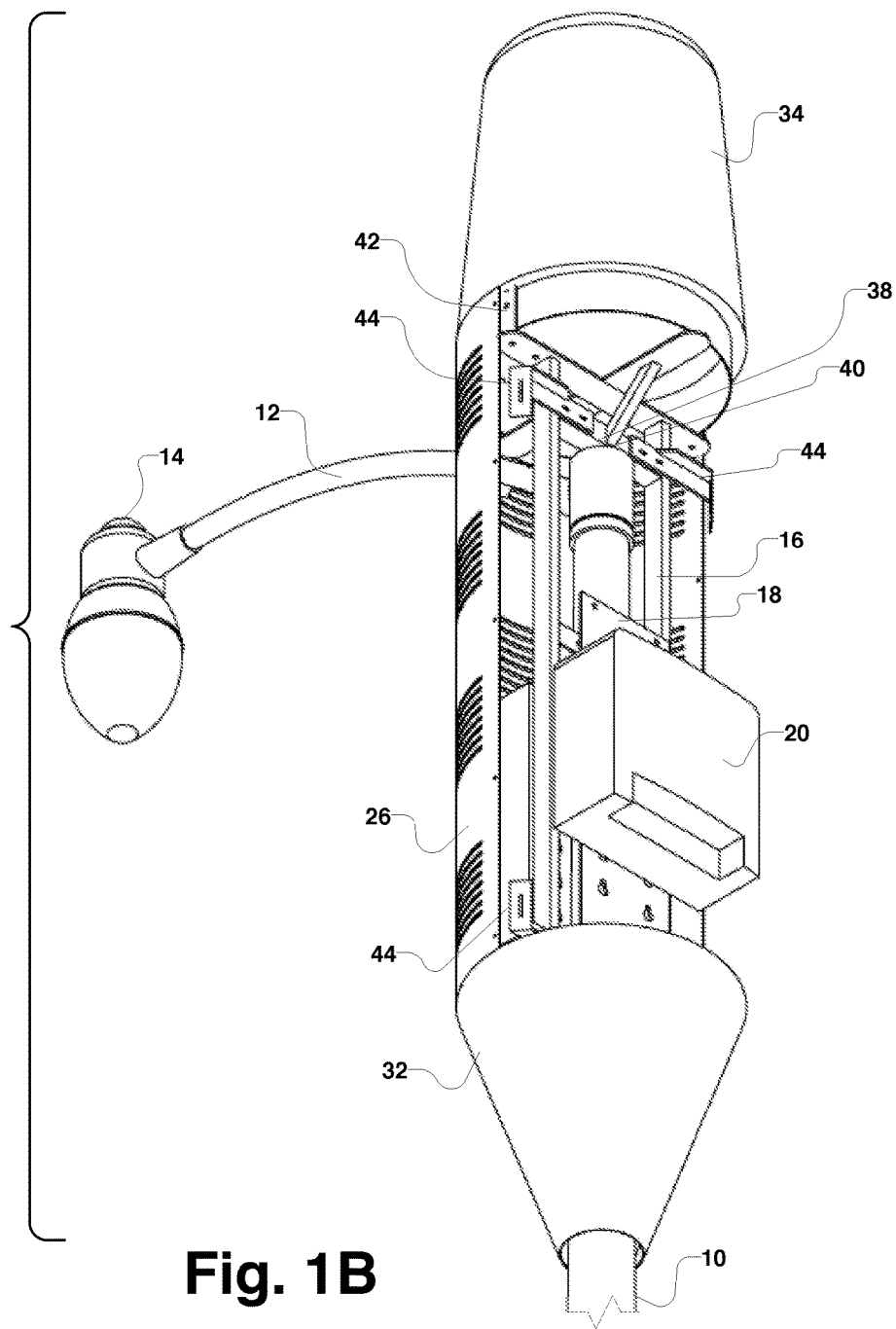
Figure 1C:
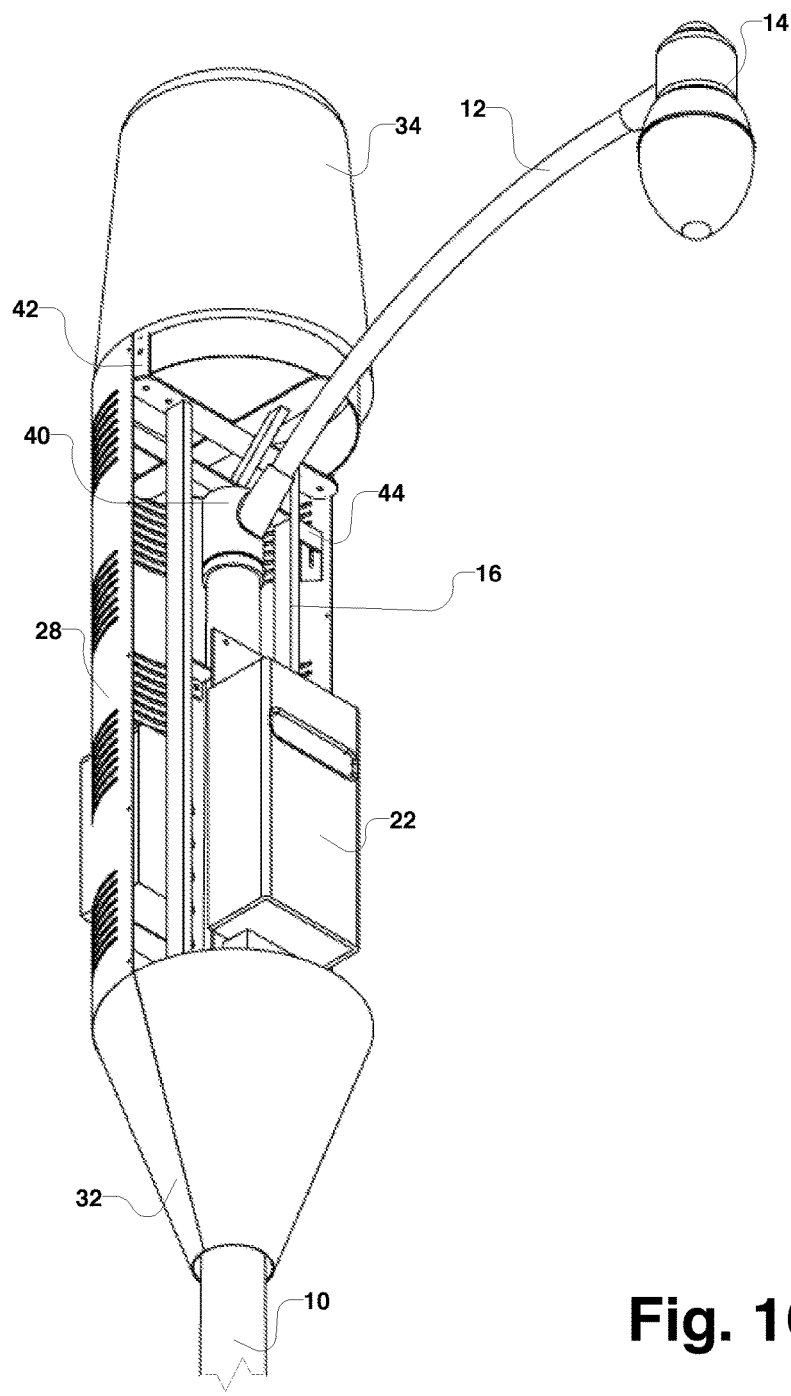

As shown in FIG. 1A, a utility pole 10 has an arm 12 with a lamp 14 at one end thereof.

A concealment enclosure kit, according to exemplary embodiments hereof, is attached to the utility pole 10, as described here.

A mounting bracket 16 (FIG. 2A) is attached to the pole 10, and one or more equipment mounting plates 18 (FIG. 3) are attached to the mounting bracket 16.

Figure 2A:
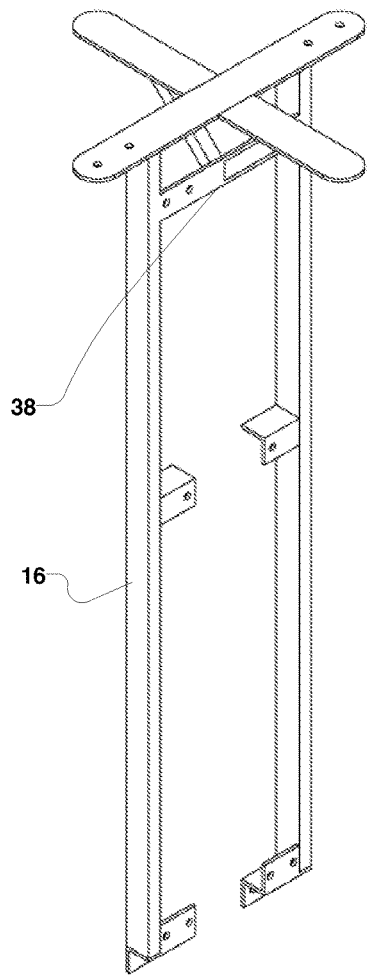
FIGS. 2A-2C and 3 show components of a concealment enclosure kit according to exemplary embodiments hereof.
Figure 2B:
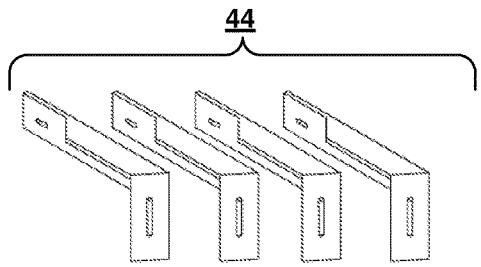
Figure 2C:
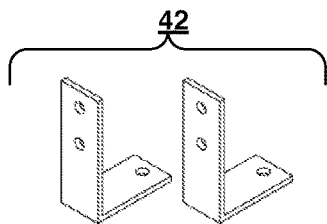

One or more pieces of communication equipment (e.g., remote radio units—RRUs) 20, 22 are attached to the equipment mounting plate(s) 18 using various adjustable mounting brackets (FIG. 2B). The RRUs 20, 22 may be any appropriately sized RRU including an RRU12 and an RRU32.

In a presently preferred implementation the equipment mounting plates 18 are T6061 aluminum mounting plates with mounting provisions for RRu11, RRu32, MRus, and RRu26. In a preferred implementation the dimensions of the equipment mounting plates 18 are 10"×39.25"×0.250".

Figure 4:
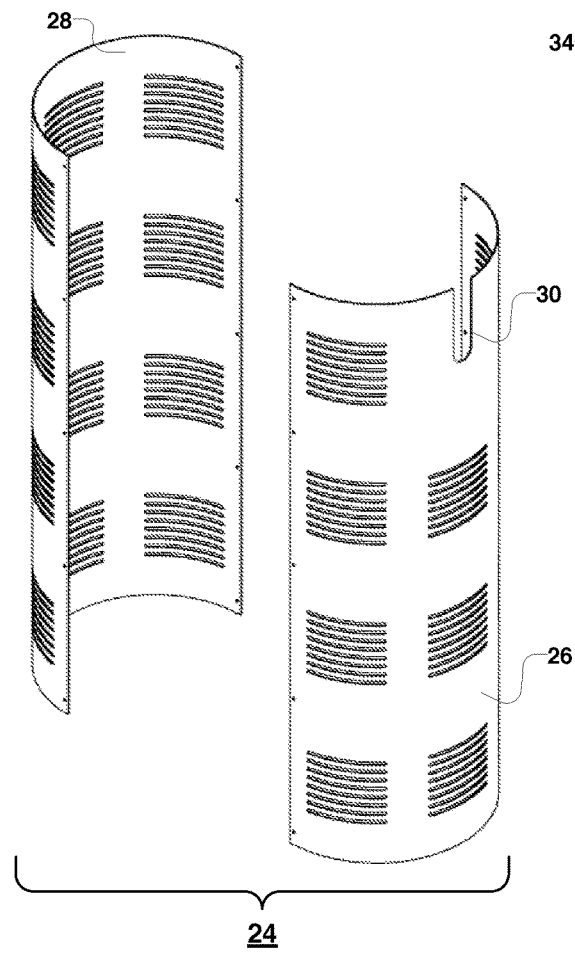
FIG. 4 shows aspects concealment shrouds according to exemplary embodiments hereof.

A concealment shroud 24 formed, e.g., from two pieces such as curved panels 26, 28 (FIG. 4) covers (e.g., wraps around) the mounting bracket 16, mounting plates 18, and any attached RRUs 20, 22. Although the concealment shroud 24 is shown in the drawings as being formed from two panels 26, 28, it should be appreciated that that concealment shroud 24 may be formed from a single panel that fits over the top or a top part of the pole 10 or from more than two panels that may be joined to cover and conceal the mounting bracket and attached equipment. For example, three or four panels may be used to form a concealment shroud 24. Furthermore, although the drawings show two substantially equal sized panels 26, 28, a shroud 24 may be formed from different sized panels.

Although the concealment shroud 24 is shown in the drawings as being round (circular) in shape (when the component pieces 26, 28 are both attached to the mounting bracket 16), those of ordinary skill in the art will appreciate and understand, upon reading this description, that the shroud 24 may be any shape that covers the mounting bracket 16, mounting plates 18, and any attached RRUs 20, 22. For example, the shroud 24 may be rectangular or have some other preferably regular polygonal shape (e.g., a pentagon, hexagon, octagon, etc.). Furthermore, the shroud need not be symmetric.

The concealment shroud 24 may be formed from aluminum. Thus, e.g., the panels 26, 28 may be roll-formed aluminum panels. In a presently preferred embodiment the panels 26, 28 are each 14 gauge slotted roll-formed aluminum panels, although other metals and/or gauges may be used.

The concealment shroud 24 preferably includes ventilation slots for convection cooling the equipment. For example, as shown in the drawings, including FIG. 4, the panels 26, 28 each have a number of ventilation slots formed or cut therein. In a presently preferred embodiment ventilation slots are cut into the panels 26, 28 after they are roll-formed. Although the ventilation slots are shown in the drawings in a horizontal direction (with respect to the ground), the slots may be formed in different and/or other directions and not all slots need be in the same direction. For example, some or all of the ventilation slots may be vertical. In a presently preferred implementation, the slots are ⅜"×8" slots, formed at equal intervals.

Figure 5A:
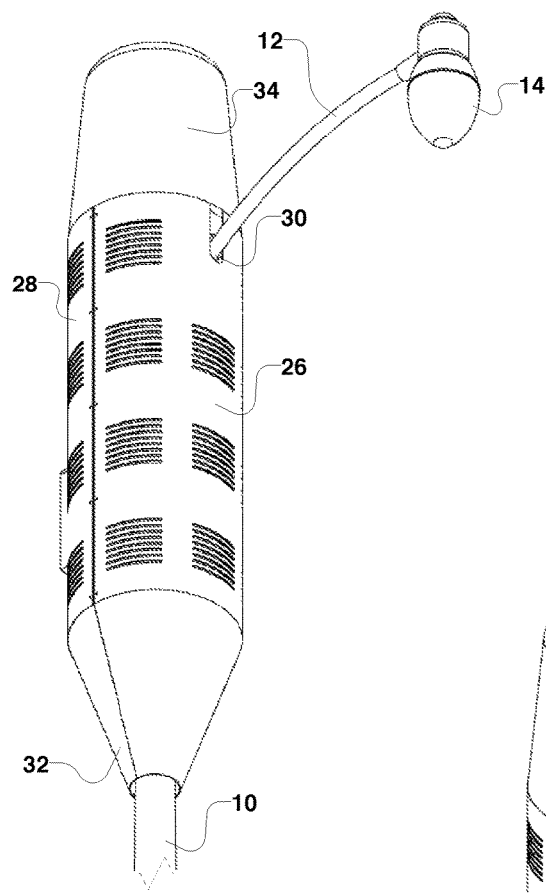
FIGS. 5A-5B show aspects of a concealment enclosure according to exemplary embodiments hereof.
Figure 5B:
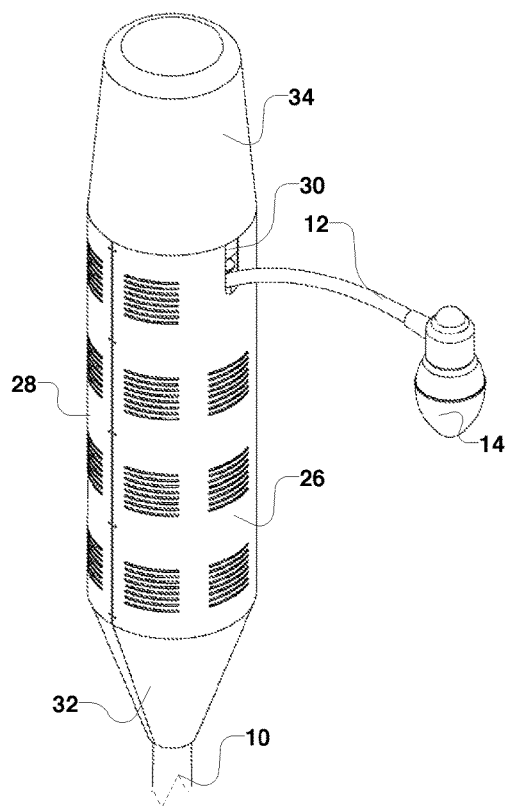

The concealment shroud 24 preferably includes at least one slot or hole to allow existing structures (e.g., lighting structures on the pole) to protrude and function. For example, as shown in the drawings, a slot 30 in panel 26 allows the arm 12 and lamp 14 to protrude from the concealment shroud 24 when in place on a pole (see, e.g., FIGS. 4, 5A-5B). The slot 30 is preferably formed in the concealment shroud 24 (e.g., in panel 26) to allow the panel to be fitted on an existing utility pole without interfering with existing structures on the pole and without requiring complex manipulation of the panel 26. For example, as shown in the drawings, the panel 26 can be positioned on the pole 10 such that the arm 12 passes through the slot 30. The arm 12 does not have to be removed or moved in order to position the panel 26 (and thus the shroud 24). As should be appreciated, if a utility pole has more than one arm and lamp fixture, then the shroud will have a corresponding number of slots, appropriately placed to allow each arm to pass through.

When the concealment shroud 24 is formed from multiple parts (e.g., the two shroud panels 26, 28), the then parts may be joined on one side by a piano hinge, allowing the combined shroud parts to be wrapped around the pole and mounting bracket 16 and attached components. Once closed around the pole, the other sides may be joined by fasteners.

Figure 6:
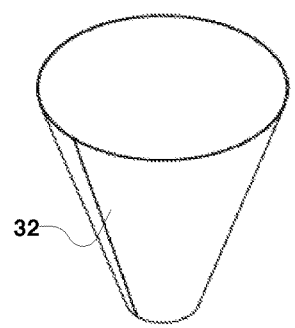
FIG. 6 shows aspects of a bottom part of a concealment enclosure kit according to exemplary embodiments hereof.

The lower part of the mounting bracket 16 (and associated mounted components) may be concealed by a bottom portion 32, e.g., a conical piece as shown in the drawings (e.g., in FIG. 6).

The bottom portion 32 may be formed from a single piece of roll-formed aluminum, e.g., as shown in FIG. 6 that may be wrapped around a pole. In some embodiments, the bottom portion 32 may be formed from multiple pieces (e.g., two or three or more pieces that may fit together). Although shown in the drawings as being conical in shape, the bottom portion may be rectangular or cylindrical or have some other shape. Preferably, the top part of the bottom portion matches the shape of the bottom of concealment shroud. Thus, for the embodiment shown, the top part of the bottom portion 32 preferably has a shape/diameter that matches that of the bottom of the bottom of the concealment shroud 24 when the shroud and bottom portion 32 are in place on a utility pole. In this way, when in place on a utility pole, the bottom of the concealment shroud 24 (e.g., the bottom of curved panels 26, 28) meets the top of bottom portion 32, thereby providing a substantially matching and continuous profile or silhouette at the join.

When on a pole, the bottom portion 32 may be welded to each shroud half by process of MIG (Metal Inert Gas) welding, with 1.5"×⅛" fillet butt welds at 3-inch intervals to prevent distortion.

Figure 7:
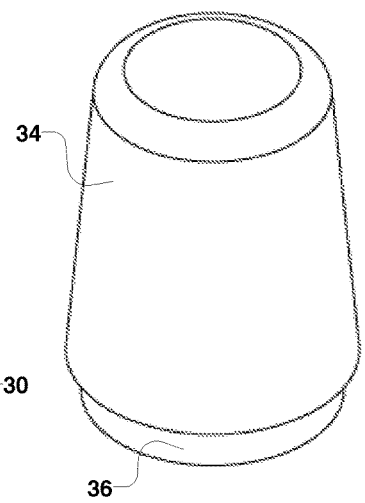
FIG. 7 shows aspects of a top part or cap of a concealment enclosure kit according to exemplary embodiments hereof.

A top piece or cap 34, preferably a radome cap, covers the top of the concealment shroud 24 (when in place). The cap 34 is preferably a tapered hollow dome, e.g., as shown in FIG. 7. The cap 34 is preferably formed from a composite material. As should be appreciated, a composite material is beneficial for its lightweight and ability to propagate RF with minimal power loss.

The cap 34 is preferably includes fasteners to allow attachment to mounting bracket 16. The bottom of the cap 34 preferably has an outer shape/diameter that matches that of the top of the concealment shroud 24 when the shroud and cap 34 are in place on a utility pole. In this way, when in place on a utility pole, the top of the concealment shroud 24 (e.g., the top of curved panels 26, 28) meets the bottom of the cap 34, thereby providing a substantially matching and continuous profile or silhouette. The bottom of the cap 34 preferably includes a lip portion 36 that engages with the top of the concealment shroud 24 when the shroud and cap 34 are in place on a pole.

The cap 34 or radome serves as a concealment of various antennas attached to the pole (via the mounting bracket). In a presently preferred implementation, the cap 34 (or radome) is vacuum formed as a combination of 3/16" ABS plastic with a 1/16" thermoplastic acrylic-polyvinyl chloride overlay (e.g., Kydex) for long-term outdoor use.

Figure 3:
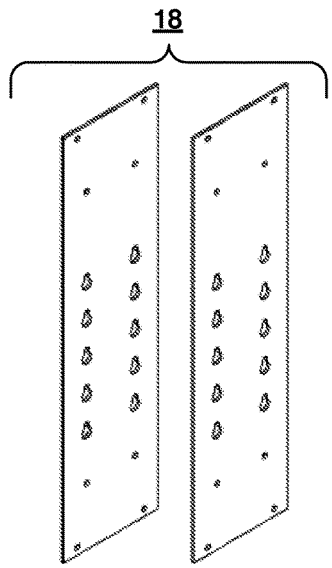

The mounting bracket 16, e.g., as shown in FIG. 2A, preferably includes slots or holes for connection to the mounting plates 18 (FIG. 3). In preferred embodiments, when in place on a utility pole, the mounting bracket 16 sits on or near the top of a pole. For example, with reference to FIGS. 1A-1C and 2A, a portion 38 of the mounting bracket 16 sits on a top portion 40 of the pole 10, thereby providing support for the mounting bracket 16 and attached components, shroud, cap and bottom portion. Those of ordinary skill in the art will appreciate and understand, upon reading this description, that the mounting bracket may be mounted anywhere on a pole, and need not be mounted at the top of a pole.

In preferred embodiments, the various components described herein are provided as a concealment kit, with the various parts needed being provided in the same kit.

Preferably the external parts (the concealment shroud 24 including curved panels 26, 28, the cap 34, and the bottom portion 32) are textured and powder coated to match the utility pole's color and texture.

As shown in FIG. 2B, in addition to the mounting bracket 16, mounting plates 18, and concealment shroud 24 (including curved panels 26, 28), a cap 34, and a bottom portion 32, an exemplary concealment kit includes various adjustable mounting brackets 42, 44, for attachment of the various components to the mounting bracket 16. In a preferred embodiment of a concealment kit, the mounting brackets include two (2) adjustable dome mounting brackets 42 and four (4) adjustable shroud mounting brackets 44 (two brackets for the one shroud piece and two brackets for the other shroud piece). As should be appreciated, if there more shroud pieces then more mounting brackets may be used and provided. Furthermore, those of ordinary skill in the art will appreciate and understand, upon reading this description, that different mechanisms may be used to attach some or all of the components to the mounting bracket 16.

As used herein, the term "attachable," means attachable directly or via another component. Thus, the term "attachable to the mounting bracket," means attachable to the mounting bracket directly or via another component (e.g., another bracket).

Although not shown, it should be understood that a concealment kit should include various nuts and bolts to attach the mounting plates 18 to the mounting bracket 16; to attach the adjustable shroud mounting brackets 44 to the mounting bracket 16 and to the shroud panels 26, 28; and to attach the bottom part 32 to the mounting bracket 16; and to attach the cap 34 to the mounting bracket 16.

FIGS. 8A-8D show various side views of a concealment shroud, cap, and bottom portion attached to a utility pole 10. As can be seen from the drawings, when the components are mounted on a utility pole, the profile or silhouette of the combined concealment shroud, cap, and bottom portion is substantially continuous.

Although the embodiments hereof are described with respect to a lamp pole, it should be appreciated that the utility pole 10 may be any type of utility pole and need not be a lamp pole. Furthermore, although the embodiments hereof are described with respect to utility poles, it should be appreciated that the pole may be any type of pole (including, e.g., power poles).

The RRUs may be provided separately or as part of a kit that includes the concealment components.

EXAMPLE

In one preferred implementation, the height of the cap is about 32 inches, with a lip portion being about 4 inches; the height of the shroud is about 51 inches, and the height of the bottom (conical) portion is about 25 inches, giving the entire concealment mechanism a height of about 104 inches when attached to a pole. In this implementation, the cap has a diameter of 23.5 inches. (The drawings are not drawn to scale.)

Although concealment of antennas and antenna systems is described herein, those of ordinary skill in the art will appreciate and understand, upon reading this description, that any kind of equipment or communications systems may be concealed using the mechanisms described herein. The equipment being concealed may be electrical or non-electrical. The invention is not limited by the kind or nature of the equipment being concealed or whether the equipment on a pole is fully concealed.

Thus are described a mechanism to attach and conceal equipment such as an antenna system and/or other communications system on an existing pole (such as a utility pole), as well as a kit that allows an existing pole to be retrofitted with a concealed antenna system and/or other communications system, without requiring the pole to be replaced and without interfering with the operation of equipment (e.g., a lamp system) already on the pole.

As used herein, the term "kit" refers generally to a system or collection of components. The components of a kit need not be supplied or manufactured together.

Where a process is described herein, those of ordinary skill in the art will appreciate that the process may operate without any user intervention. In another embodiment, the process includes some human intervention (e.g., a step is performed by or with the assistance of a human).

As used in this description, the term "portion" means some or all. So, for example, "A portion of X" may include some of "X" or all of "X". In the context of a conversation, the term "portion" means some or all of the conversation.

As used herein, including in the claims, the phrase "at least some" means "one or more," and includes the case of only one. Thus, e.g., the phrase "at least some ABCs" means "one or more ABCs", and includes the case of only one ABC.

As used herein, including in the claims, the phrase "using" means "using at least," and is not exclusive. Thus, e.g., the phrase "using X" means "using at least X." Unless specifically stated by use of the word "only", the phrase "using X" does not mean "using only X."

In general, as used herein, including in the claims, unless the word "only" is specifically used in a phrase, it should not be read into that phrase.

It should be appreciated that the words "first" and "second," if in the description and claims, are used to distinguish or identify, and not to show a serial or numerical limitation. Similarly, the use of letter or numerical labels (such as "(a)", "(b)", and the like) are used to help distinguish and/or identify, and not to show any serial or numerical limitation or ordering.

While the invention has been described in connection with what is presently considered to be the most practical and preferred embodiments, it is to be understood that the invention is not to be limited to the disclosed embodiment, but on the contrary, is intended to cover various modifications and equivalent arrangements included within the spirit and scope of the appended claims.

I claim:

1. A system for concealing electronic equipment on a utility pole, the utility pole having an arm supporting at least one lamp, the system comprising:
   (A) a mounting bracket, constructed and adapted to be positioned on the utility pole;
   (B) at least one equipment mounting plate, attachable to the mounting bracket, wherein each at least one equipment mounting plate is constructed and adapted to support a corresponding piece of communication equipment attached thereto;
   (C) a concealment shroud having at least one slot and attachable to the mounting bracket;
   (D) a bottom portion, attachable to the mounting bracket; and
   (E) a cap, attachable to the mounting bracket,
   wherein, when the concealment shroud is attached to the mounting bracket on the utility pole: (i) the concealment shroud covers the mounting bracket, the at least one equipment mounting plate, and any piece of communication equipment attached to the at least one equipment mounting plate; and (ii) the arm of the utility pole passes through the at least one slot of the concealment shroud.

2. The system of claim 1, wherein a top part of the bottom portion has substantially the same shape as a bottom part of the concealment shroud and wherein a bottom part of the cap has substantially the same shape as a top part of the concealment shroud.

3. The system of claim 1, wherein the mounting bracket is constructed and adapted to be positioned at the top of the utility pole.

4. The system of claim 1, wherein the bottom portion comprises a conical piece.

5. The system of claim 4, wherein the bottom portion comprises a single piece of roll-formed aluminum.

6. The system of claim 1, wherein the cap is formed from a composite material.

7. The system of claim 6, wherein the cap includes fasteners to allow attachment of the cap to the mounting bracket.

8. The system of claim 1, wherein the concealment shroud comprises at least two curved panels.

9. The system of claim 8, wherein the two curved panels comprise ventilation slots.

10. The system of claim 8, wherein the curved panels are roll-formed aluminum panels.

11. The system of claim 8, wherein the two curved panels are joined on one side by a piano hinge.

12. A method for concealing electronic equipment on a utility pole, the utility pole having an arm supporting at least one lamp, the method comprising:
(A) attaching a mounting bracket to the utility pole;
(B) attaching at least one equipment mounting plate to the mounting bracket,
(C) attaching a corresponding piece of communication equipment to each at least one equipment mounting plate;
(D) attaching a concealment shroud the mounting bracket, said concealment shroud having at least one slot therein;
(E) attaching a bottom portion to the mounting bracket, wherein a top part of the bottom portion has substantially the same shape as a bottom part of the concealment shroud; and
(F) attaching a cap to the mounting bracket, wherein a bottom part of the cap has substantially the same shape as a top part of the concealment shroud,
wherein, when the concealment shroud is attached to the mounting bracket on the utility pole: (i) the concealment shroud covers the mounting bracket, the at least one equipment mounting plate, and the piece of communication equipment attached to the at least one equipment mounting plate; and (ii) the arm of the utility pole passes through the at least one slot of the concealment shroud.

13. The method of claim 12, wherein, in (A), the mounting bracket is attached at the top of the pole.

14. The method of claim 12, wherein the concealment shroud comprises at least two curved panels, and wherein the attaching of the concealment shroud in (D) comprises attaching each of the at least two curved panels.

15. The method of claim 14, wherein the two curved panels comprise ventilation slots.

16. The method of claim 14, wherein the curved panels are roll-formed aluminum panels.

17. The method of claim 12, wherein the bottom portion comprises a conical piece.

18. The method of claim 17, wherein the bottom portion comprises a single piece of roll-formed aluminum.

19. The method of claim 18, wherein the cap is formed from a composite material.

20. A system for concealing electronic equipment on a utility pole, the utility pole having an arm supporting at least one lamp, the system comprising:
(A) a mounting bracket, constructed and adapted to be positioned on the utility pole;
(B) at least one equipment mounting plate, attachable to the mounting bracket, wherein each at least one equipment mounting plate is constructed and adapted to support a corresponding piece of communication equipment attached thereto;
(C) a concealment shroud having at least one slot and attachable to the mounting bracket, wherein the concealment shroud comprises at least one curved panel having ventilation slots;
(D) a bottom portion, attachable to the mounting bracket; and
(E) a cap, attachable to the mounting bracket,
wherein, when the concealment shroud is attached to the mounting bracket on the utility pole: (i) the concealment shroud covers the mounting bracket, the at least one equipment mounting plate, and any piece of communication equipment attached to the at least one equipment mounting plate; and (ii) the arm of the utility pole passes through the at least one slot of the concealment shroud.

* * * * *